United States Patent [19]

Jones et al.

[11] 4,029,373

[45] June 14, 1977

[54] MEANS FOR WIRING INTO A SEALED ENCLOSURE

[75] Inventors: Glen D. Jones, Orange; Michael J. Raffetto, Palos Verdes Peninsula, both of Calif.

[73] Assignee: Xerox Corporation, Stamford, Conn.

[22] Filed: Aug. 3, 1973

[21] Appl. No.: 385,356

[52] U.S. Cl. .............................. 339/17 R; 174/151; 339/94 M; 361/397
[51] Int. Cl.² .......................................... H05K 1/02
[58] Field of Search .................. 339/17, 18, 61, 60, 339/94, 126, 128, 176, 94 A, 275 R, 275 B, 195 R, 177, 17 R, 17 L, 17 LC; 317/101 R, 101 CC, 101 D, 101 DH; 174/151, 152, 153, 138; 16/2; 248/56

[56] References Cited
UNITED STATES PATENTS

| | | | |
|---|---|---|---|
| 2,343,664 | 3/1944 | Heiser et al. | 339/275 B X |
| 2,647,942 | 8/1953 | Borden et al. | 16/2 X |
| 2,833,998 | 5/1958 | Alden | 339/275 R X |
| 2,967,284 | 1/1961 | Bailey et al. | 339/94 M X |
| 3,057,001 | 10/1962 | Rapata | 339/103 B |
| 3,097,259 | 7/1963 | McMillen, Jr. et al. | 174/153 |
| 3,149,897 | 9/1964 | Martinek | 339/176 MF X |
| 3,229,026 | 1/1966 | Sulzer | 339/103 B |
| 3,329,926 | 7/1967 | Asku et al. | 339/17 L X |
| 3,660,728 | 5/1972 | Carter | 317/101 CC X |
| 3,753,207 | 8/1973 | Maheux et al. | 339/17 F |
| 3,793,672 | 2/1974 | Wetmore | 16/2 |

*Primary Examiner*—Roy D. Frazier
*Assistant Examiner*—Terrell P. Lewis
*Attorney, Agent, or Firm*—James J. Ralabate; Ronald L. Taylor; Franklyn C. Weiss

[57] ABSTRACT

Improved apparatus for wiring through a wall of a sealed enclosure is disclosed. A printed circuit board is mounted on and extends through a slot in the wall, said board etched so that a plurality of conducting lines are provided from inside to outside the enclosure. Standard printed circuit board connectors are mounted on and soldered to the board providing convenient means for the attachment of cables to the board. Finally, the slot space between the printed circuit board and the wall is sealed with a rubber grommet to complete the sealing of the enclosure.

6 Claims, 4 Drawing Figures

MEANS FOR WIRING INTO A SEALED ENCLOSURE

BACKGROUND OF THE INVENTION

This invention relates to improved apparatus for wiring through a wall of a sealed enclosure, and more specifically to the use of a printed circuit board as the conducting element through said wall as an improvement over the standard bulkhead connectors now in common use. Standard printed circuit connectors are mounted and soldered onto the etched circuit board and cable connections may be then made to the connectors by wiring the cable conductors to blank circuit boards which are inserted into the connectors. Circuit boards containing electronic components may be mounted directly into the printed circuit connectors thereby minimizing the number of cables required.

A recurring problem in the electrical industry is the requirement to make numerous electrical connections to a piece of equipment that must operate in a sealed enclosure. An example of such equipment in the data processing field is a disc drive system wherein the discs themselves must be sheltered from abrasive contaminants which would cause wear between the recording heads and the recording surface, thereby appreciably shortening the useful life of the discs and heads. Therefore, the discs are kept inside a pressurized enclosure wherein a stream of filtered air is constantly blown over the surfaces of the discs.

Concurrently, a large number of connections must be made to the recording heads. This problem is particularly bothersome in a head-per-track system where a large number of wires are necessary. In the typical installation, a double ended bulkhead connector is used. In the case where a large number of wires are necessary an excessively large bulkhead connector or a number of bulkhead connectors are required. Standard cable connectors are expensive, the electrical characteristics of each line in a connector is unpredictable since the impedance characteristics are dependent upon the location of the wire in the bundle, the fabrication costs are high since the wiring of a connector must be done by hand, and wiring errors in the assembly of connectors are common.

SUMMARY OF THE INVENTION

The present invention provides a low cost and highly reliable method of routing a large number of wires through a sealed enclosure. The actual conducting member is a multilayer printed circuit board with a width slightly larger than the length of a standard printed circuit connector and with a length large enough to accommodate two sets of printed circuit board connectors. In manufacturing, the printed circuit connectors are soldered to the printed circuit board. The board is then inserted into the sealed enclosure, held in place by a suitable bracket, and the remaining open spaces sealed.

There are numerous advantages to wiring through an enclosure in this manner. Manufacturing costs are considerably lower since the entire assembly can be made easily from readily available materials. Wiring cost and errors are eliminated since the wiring connections are contained within a predesigned circuit board which is produced by automatic manufacturing processes. Finally, use of a multilayered circuit board with etched lines surrounded by ground layers allows control of electrical characteristics since the location of each conductor is known with respect to the other conductors and the ground plane.

It is therefore the object of this invention to provide a low cost and easily manufactured method of wiring through the wall of an enclosure, wherein the electrical characteristics of each conductor may be controlled.

DETAILED DESCRIPTION OF THE INVENTION

Figure 1:
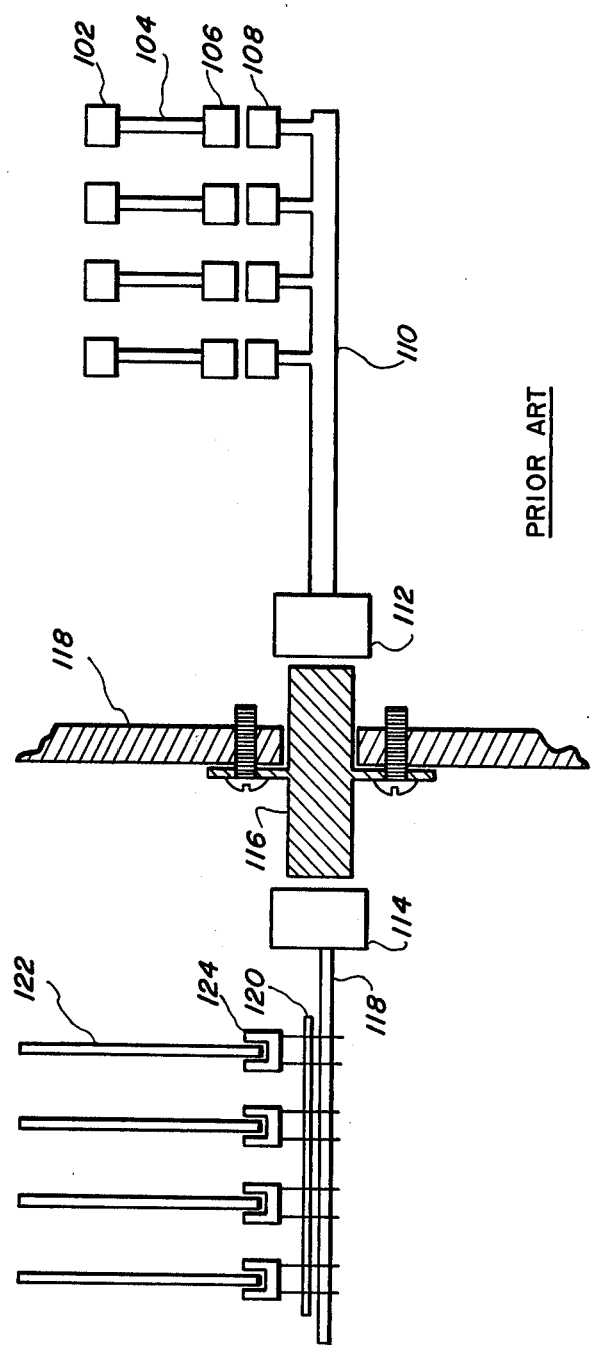
FIG. 1 is a schematic representation of a system of wiring through a bulkhead using a standard bulkhead connector.

FIG. 1 is a simplified cross sectional view of a general wiring system through a wall of a sealed enclosure using bulkhead connectors. Four recording heads 102 with attached ribbon cables 104 terminating in connectors 106 are connected to cable 110 by matching connectors 108. Connectors 112 and 114 are coupled to bulkhead connector 116 which is mounted on bulkhead 118. Connector 114 is attached to cable 118 which is wired, soldered or wire-wrapped onto back plane 120 of a cage of printed circuit cards 122 containing the read/write electronics for the heads 102. The printed circuit boards 122 are plugged into circuit board connectors 124. The back plane wiring 120 thus makes electrical connections between cable 118 and connectors 124. In this way, the read/write electronics mounted on circuit boards 122 are ultimately connected to the read/write heads 102 through the sealed enclosure bulkhead 118.

Figure 2:
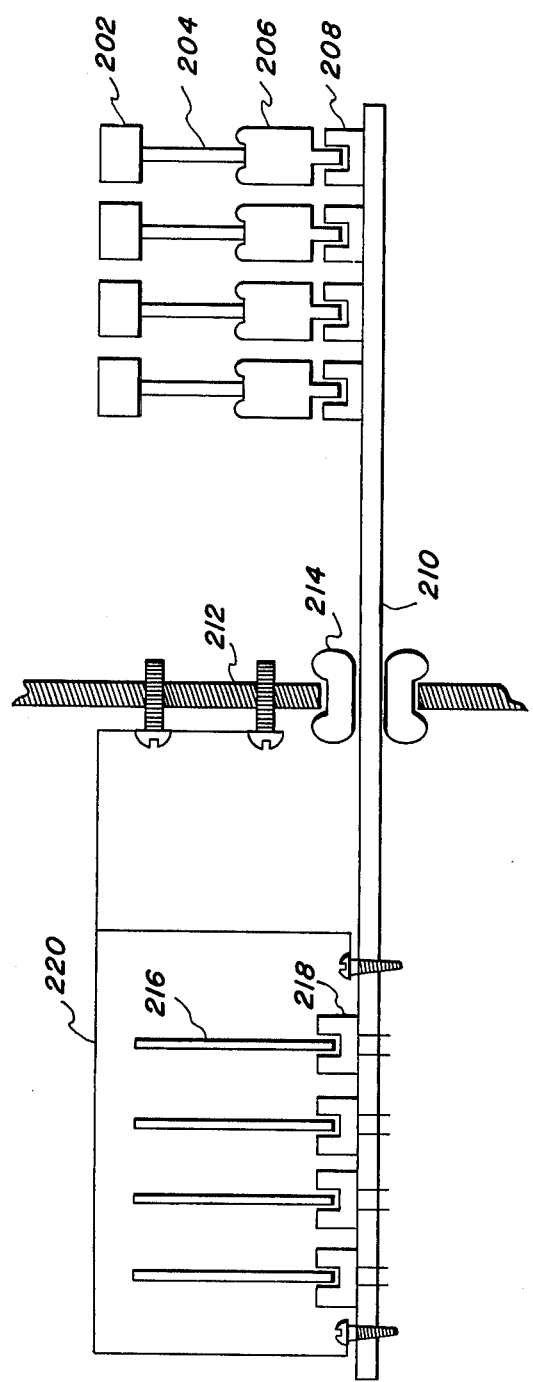
FIG. 2 is a schematic representation of wiring through bulkhead using this invention.

FIG. 2 is a simplified cross sectional view of an embodiment of this invention. Read/write heads 202 are coupled through ribbon cables 204 to ribbon cable connectors 206 which are plugged into printed circuit connectors 208. These printed circuit connectors are soldered directly onto printed circuit board 210 which extends through bulkhead 212. The remaining space between bulkhead 212 and circuit board 210 is sealed by grommet 214. Read/write electronics mounted on printed circuit boards 216 are inserted into connectors 218 which are soldered directly onto printed circuit board 210. Card cage structure 220, which is securely fastened to bulkhead 212, supports the printed circuit board 210 in its indicated position.

A comparison of FIG. 1 and FIG. 2 will show that the back plane wiring and two sets of cables and connectors in FIG. 1 are replaced by a printed circuit board in FIG. 2, resulting in a number of advantages. The cost is considerably lower since printed circuit boards can be manufactured at far lower cost than the cable-connector equivalent. Wiring errors are eliminated since connections are made through a printed circuit board which is automatically manufactured rather than through two sets of connectors that must be hand-wired. There is a much greater control over the electrical characteristics of each conductor since large discontinuities in line impedance always occur at cable connections whereas the control over line impedance on an etched board may be controlled by varying the width of the conducting line and by spacing it with respect to the ground plane. The resultant equipment is more reliable since there are fewer connections and therefore fewer sources of malfunction.

Figure 3:
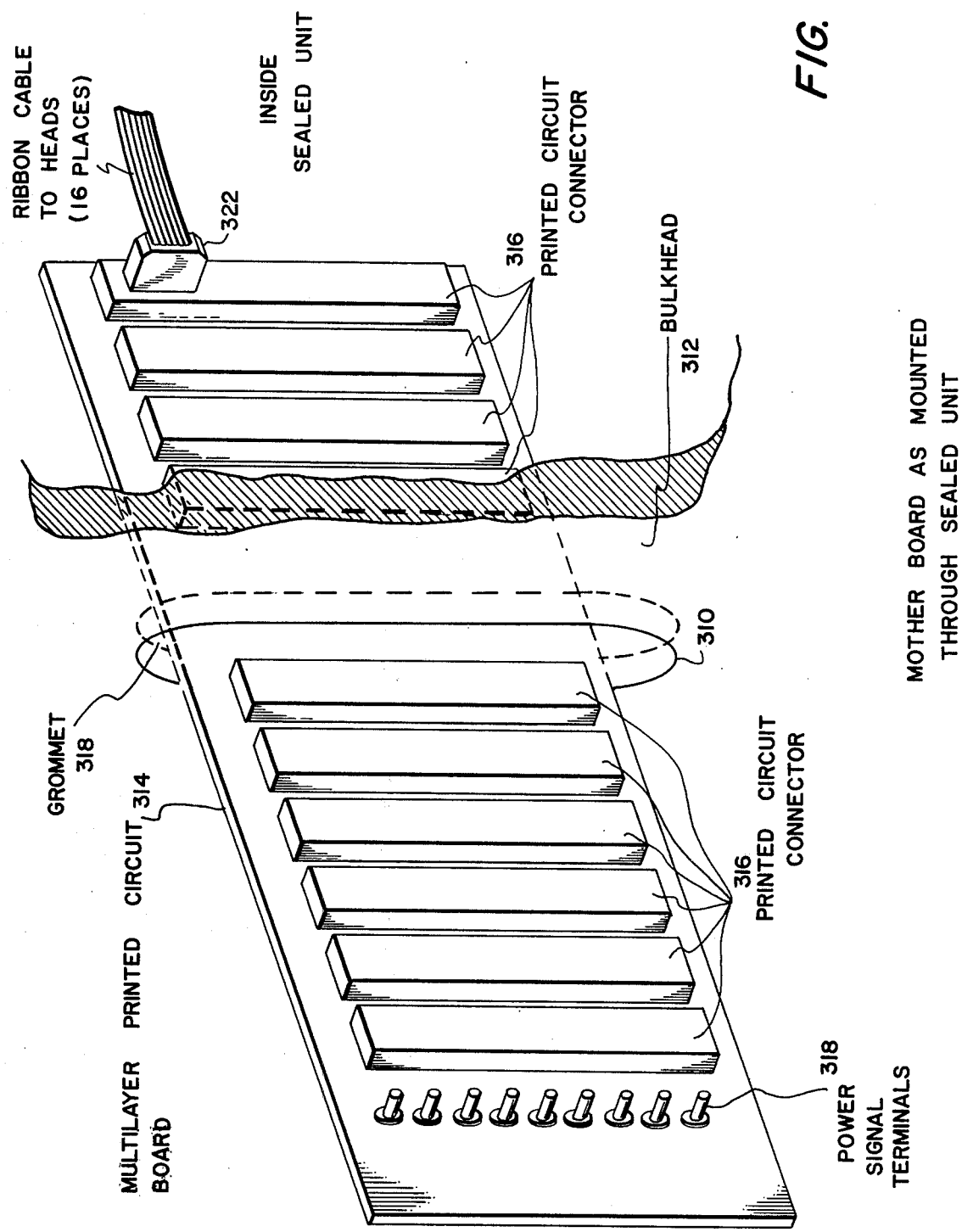
FIG. 3 is a typical use of the invention showing the printed circuit board and a full set of connectors.

FIG. 3 is a perspective view of one embodiment of the present invention. A slot 310 is cut into bulkhead 312 of a sealed enclosure. This slot is of suitable dimensions to allow passage of the printed circuit board 314 with the printed circuit connectors 316 attached thereto. The circuit board is attached to the bulkhead either by the card cage hardware or by any other suitable bracket means. The remaining space between the printed circuit board and the bulkhead is then sealed with a rubber grommet 318 or any other suitable sealing means. Printed circuit connectors 316 are attached to the printed circuit board by inserting the printed circuit connector pins through corresponding holes in the printed circuit board and soldering them in place. Power and signal terminals 318 may also be provided on the printed circuit board. Connections are made on both inside and outside connectors by means of ribbon cables 320 or other wiring means soldered to blank circuit boards 322 or suitable connectors which are in turn pluged into the printed circuit C-connectors 316.

Figure 4:
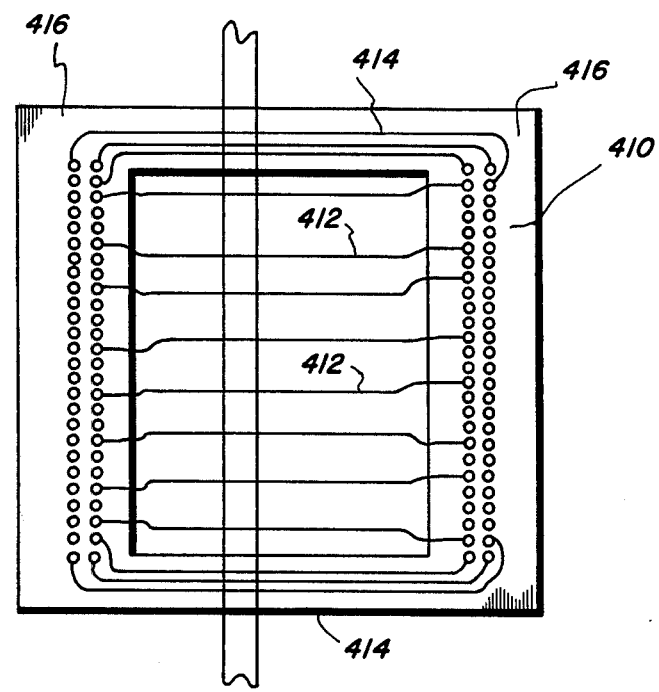
FIG. 4 is a simplified view of the etched lines on a printed circuit board.

FIG. 4 shows the layout of a typical printed circuit board. For reasons of simplicity, only one set of connector mounting holes is shown at each end of the board. Each connector is mounted into a series of 52 holes 410. Eight signal conducting lines 412 are shown spaced evenly across the center of the board. Power, ground and test point lines 414 are shown located along the edges of the board. The shaded area 416 is a ground plane which may be implemented from one layer of the multilayer board. With this construction it can be seen that the signal lines 412 are equally spaced from each other and distantly spaced from the ground plane and the power lines thereby achieving a known characteristic line impedance and very low capacitance.

Although the invention has been specifically disclosed in connection with a particular printed circuit board construction, it will be apparent that many variations are possible in the type of hardware mounting means, sealing means and connectors that may be mounted on a circuit board to achieve the object of this invention, all without departing from the spirit of the invention as defined in the following claims.

What is claimed is:

1. Apparatus for wiring through the wall of a sealed enclosure comprising:
    a printed circuit board extending through a slot in said wall, said printed circuit board having a plurality of etched conductors extending from an area of said board inside said enclosure to an area of said board outside said enclosure,
    means mounted on said printed circuit board and electrically connected to the ends of said etched conductors for providing electrical connections to said etched conductors, and
    means for sealing the space between said wall and said printed circuit board.

2. The apparatus of claim 1 wherein said means for making electrical connection comprises printed circuit connectors mounted on said printed circuit board having terminals soldered to said etched conductor lines.

3. Apparatus for wiring through the wall of a pressurized enclosure comprising:
    a printed circuit board mounted in a slot within said wall, said printed circuit board having etched conductor lines extending from an area of the board inside said enclosure to an area of the board outside said enclosure,
    means mounted securely between said wall and said printed circuit board for providing a pressurized seal between said printed circuit board and said wall, and
    means for making electrical connectors to said etched conductor at the end inside the enclosure and at the end outside the enclosure.

4. The apparatus in claim 3 wherein said etched conductor lines are spaced equidistantly from each other for controlling the capacitance between each conductor.

5. Apparatus for wiring through a sealed enclosure wall comprising:
    a printed circuit board mounted on said wall and extending through a slot in said wall, said printed circuit board having etched conductors extending from an area of the board inside said enclosure to an area of the board outside said enclosure, each end of said etched line terminating in a point on the board adapted to be connected to a printed circuit connector pin,
    at least one printed circuit connector mounted on each end of said board whereby each point of termination of said etched conductor is electrically connected to a connector pin, and
    means for sealing the space between said printed circuit board and said wall.

6. The apparatus in claim 5 wherein the printed circuit board has a plurality of layers at least one of which is a ground plane adapted to improve the line inpedance characteristics of said etched conductors and to provide electrical shielding of said conductors.

* * * * *